United States Patent [19]
Niki

[11] Patent Number: 4,620,147
[45] Date of Patent: Oct. 28, 1986

[54] SIGNAL DETECTOR

[75] Inventor: Shoji Niki, Saitama, Japan

[73] Assignee: Takeda Riken Co., Ltd., Tokyo, Japan

[21] Appl. No.: 580,888

[22] Filed: Feb. 16, 1984

[30] Foreign Application Priority Data

Feb. 21, 1983 [JP] Japan .................................. 58-28298

[51] Int. Cl.⁴ ............................................ G01R 23/16
[52] U.S. Cl. .................... 324/77 A; 455/243
[58] Field of Search ............... 324/77 A, 99 D, 103 P,
324/77 C, 77 R, 97 D, 77 H; 328/150; 455/164,
169, 234, 248, 249, 253

[56] References Cited

U.S. PATENT DOCUMENTS

| | | | |
|---|---|---|---|
| 2,283,523 | 5/1942 | White | 455/243 |
| 3,124,746 | 3/1964 | Strathman | 324/77 A |
| 3,452,278 | 6/1969 | Myers | 324/77 A |
| 3,605,014 | 9/1971 | McCracken | 324/77 A |
| 4,186,351 | 1/1980 | Brefini | 455/243 |

Primary Examiner—Michael J. Tokar
Attorney, Agent, or Firm—Staas & Halsey

[57] ABSTRACT

A signal detector identifies a desired frequency component having the greatest amplitude in an input signal containing other frequency components of smaller amplitude such as spurious noise, etc. This allows measuring for instance the frequency of the desired frequency component. The envelope of an intermediate frequency signal corresponding to the desired frequency component is set to be above a desired level in a single sweep of a local oscillator by comparing the envelope with a predetermined value for controlling the attenuation of the input signal. After the attenuation is thusly set, only the desired frequency component has an envelope larger than the predetermined value, so that the desired frequency component is easily identified thereby in the next sweep.

19 Claims, 8 Drawing Figures

SIGNAL DETECTOR

BACKGROUND OF THE INVENTION

This invention relates to a signal detector which detects an input signal for measuring, for example, the frequency of the input signal, and especially to a signal detector which detects a frequency component having the largest amplitude among a plurality of frequency components contained in the input signal.

In measuring a frequency component of an input signal whose frequencies are in a microwave or higher band, a direct count by a frequency counter for instance is not possible, or, when it is possible, an extremely expensive counter is required. For avoiding this difficulty, generally, a counter which includes a frequency converter is employed and the input signal is mixed with a local signal so as to be converted to an intermediate frequency signal having a frequency which can be counted by a ordinary circuit arrangement.

The frequency converter in the counter usually includes a harmonic mixer for obtaining intermediate frequency signals not only of a sum and a difference of the fundamental frequency of the input signal and the local signal, but also sums and differences of the frequency of the input signal and the harmonic frequencies of the local signal.

One of the known frequency measuring apparatuses employing a frequency converter is illustrated in FIG. 1. A local signal from a local oscillator 33 and an input signal from a terminal 31 are fed into a frequency converter 32, whereby these are mixed with each other, and intermediate frequency signals are produced having frequencies equal to the sum or the difference between the frequencies of the input and local signals. The frequency of the local signal is linearly changed by a sweep signal from a sweep generator 44. The intermediate frequency signal is amplified by an amplifier 34 which has the characteristics of a relatively wide bandpass filter.

An amplitude detector 35 determines whether the amplitude of the intermediate frequency signal from the amplifier 34 is higher than a predetermined voltage level. If the intermediate frequency signal exceeds the predetermined voltage level, the amplitude detector 35 generates a detection signal to provide it to a control circuit 43. When the detection signal is generated, the sweep operation of the local oscillator 33 is temporarily stopped by a sweep stop command from the control circuit 43 and the frequencies of both the local signal and the intermediate frequency signal are measured. Namely, the local signal and the intermediate signal are gated by gate circuits 36 and 37 whose other input terminals are provided with a gate signal from a gate signal generator 38, and the number of pulses in the gated signals are counted by the counters 39 and 40.

After the measurement, the control circuit 43 provides a sweep restart command to the sweep generator 44, so that the frequency of the local oscillator 33 is again linearly changed a little. After a small change of the local frequency, the sweep operation is again stopped by the sweep stop command, and the frequencies of both the local and intermediate frequency signals are again counted by the counters 39 and 40. Namely, the frequency measurement occurs at least twice in a certain small time interval with slightly different local frequencies under the control of the control circuit 43. The counted values in the first and second measurement are stored in a calculator 41 so as to calculate the frequency of the input signal detected by the amplitude detector 35.

Let it be assumed that the input signal frequency is $F_x$, the local signal frequencies counted in the first and second measurements are $F_{L1}$ and $F_{L2}$, respectively, the intermediate frequency signal frequencies counted in the first and second measurements are $F_{i1}$ and $F_{i2}$, and the harmonic number of the local signal is N. In the case where the input signal frequency $F_x$ is higher than the local signal frequency, the following relations are obtained.

$$F_x = NF_{L1} + F_{i1} \quad (1)$$

$$F_x = NF_{L2} + F_{i2} \quad (2)$$

$$N = -(F_{i1} - F_{i2})/(F_{L1} - F_{L2}) \quad (3)$$

Therefore, the harmonic number N of the local signal is obtained by equation (3) and the input signal frequency $F_x$ can be calculated by equation (1) or (2) by applying the harmonic number N. A calculator 41 calculates the input frequency $F_x$ according to equations (1) to (3) with use of the counted values obtained in the first and second measurements. The input signal frequency thus obtained can be displayed by a display 42.

In this frequency measuring apparatus, since the amplitude detector 35 generates a detection signal when an intermediate frequency signal exceeds the predetermined voltage level, no correct frequency measurement can be expected when a spurious signal which has an amplitude larger than the predetermined voltage level is contained in the input signal. Namely, when the voltage level of the spurious signal at the amplitude detector 35 is higher than the predetermined detection level, the detector 35 generates a detection signal in synchronism with the occurrence of the spurious signal. As a result, the frequency of the spurious signal, instead of the input signal, is measured.

Input signals usually contain harmonic and non-harmonic spurious signals. In other words, generally there is a plurality of frequency components in an input signal, but frequently the true input signal that is to be detected and measured has the largest amplitude among the components. In this case it is necessary to detect the frequency component which has the largest amplitude among the plurality of frequency components contained in the input signal, for correctly measuring the desired signal.

SUMMARY OF THE INVENTION

It is an object of the present invention to provide a signal detector which is capable of quickly detecting the frequency component having the largest amplitude among many frequency components contained in an input signal.

It is another object of the present invention to provide a signal which is capable of correctly detecting the largest frequency component, even when the difference in amplitude between a plurality of the frequency components is small.

It is a further object of the present invention to provide a signal detector which has a relatively simple construction.

In this invention, an intermediate frequency signal is provided to a peak hold circuit after being demodulated in amplitude by an envelope detector. The peak-hold circuit keeps the peak voltage of the frequency components derived from the intermediate frequency signal, and provides the peak voltage to an attenuator for controlling the voltage level of the intermediate frequency signal. The attenuator increases or decreases the input signal level, and consequently the level of the intermediate frequency signal, according to the voltage level maintained in the peak-hold circuit. If the peak voltage is large the attenuation is increased, and if the peak voltage is small the attenuation is decreased. Namely, a negative feedback loop is made up of the peak hold circuit and the attenuator. The attenuation of the attenuator is adjusted so that the amplitude of the intermediate frequency signal at the input of a comparator exceeds a reference level by a small amount.

This procedure is repeated according to the occurrence of frequency components and according to the amplitude of each frequency component within the first sweep of the local oscillator. As a result, the frequency component having the largest amplitude is detected. Thereafter, this peak voltage corresponding to the largest frequency component is retained at the same level until the next reset signal occurs, so that the total gain of the signal detector is determined by the peak voltage. In the next sweep, a comparator generates a comparison signal when the maximum frequency component is detected, so that the detected maximum frequency component is supplied to a measuring circuit, such as a counter for counting its frequency.

According to this invention, even when spurious signals are contained in the input signal, the desired signal can be detected by searching for the maximum frequency component in a plurality of frequency components. Further, the detection is completed within a single sweep, so that the total time for detection and measurement is greatly reduced. The adjustment of attenuation is made according to the peak voltage of the intermediate frequency signal, and the detection can be accurately completed even when the difference of the amplitudes between the frequency components is small.

DESCRIPTION OF THE PREFERRED EMBODIMENTS

Figure 2:
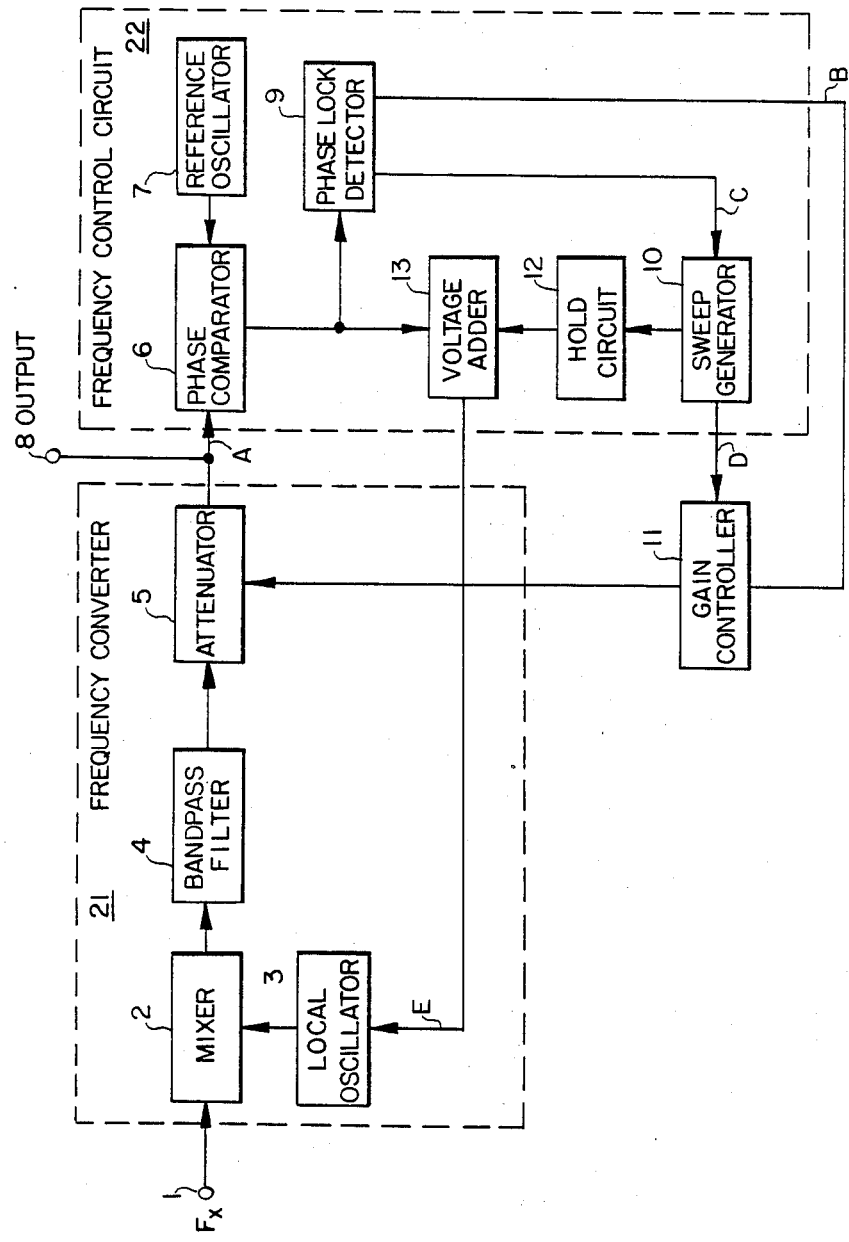
FIG. 2 is a block diagram of a conventional signal detector for detecting a signal having the maximum amplitude.

To facilitate a better understanding of the present invention, a description will be given of a conventional signal detector. FIG. 2 shows a block diagram of a conventional signal detector which can detect the frequency component having the maximum amplitude among a plurality of frequency components contained in an input signal. The input signal at a terminal 1 is provided to a mixer 2, where it is mixed with a local signal from a local oscillator 3. The output from the mixer 2 is supplied through a bandpass filter 4 to an attenuator 5 whose attenuation value is controlled electronically, and the attenuated output is provided to an output terminal 8. The mixer 2, the local oscillator 3, the bandpass filter 4 and the attenuator 5 constitute a frequency converter 21. The frequency of the local signal is linearly altered by a sweep signal from a sweep generator 10.

The output of the frequency converter 21 is supplied to a phase comparator 6, where it is compared in phase with a reference signal from a reference oscillator 7, and a voltage which is proportional to the phase difference is generated. This difference voltage is fed back to the local oscillator to control its frequency, that is, a phase lock loop is constructed in the signal detector. A phase lock detector 9 checks the phase lock loop, namely as to whether the loop is locked in or not, by watching the voltage from the phase comparator. The sweep signal generated by the sweep generator 10 is provided to a voltage adder 13 through a hold circuit 12.

The sweep signal is stopped from sweeping by a detection signal from the phase lock detector 9 if the phase lock loop is locked in. The voltage from the phase comparator 6 is also provided to the voltage adder 13, whereby it is added to the output from the hold circuit 12, and the frequency of the local oscillator is controlled by the combined voltage. The phase comparator 6, the reference oscillator 7, the phase lock detector 9, the sweep generator 10, the hold circuit 12 and the voltage adder 13 constitute a frequency control circuit 22. The sweep generator 10 also supplies a trigger signal to a gain controller 11 at the end of each sweep so as to control the attenuation value of the attenuator 5 by the resulting output signal from the gain controller 11. The other output of the phase lock detector 9 is provided to the gain controller 11, to set the attenuation of the attenuator 5 to the maximum value, at the start of the operation.

Figure 3:
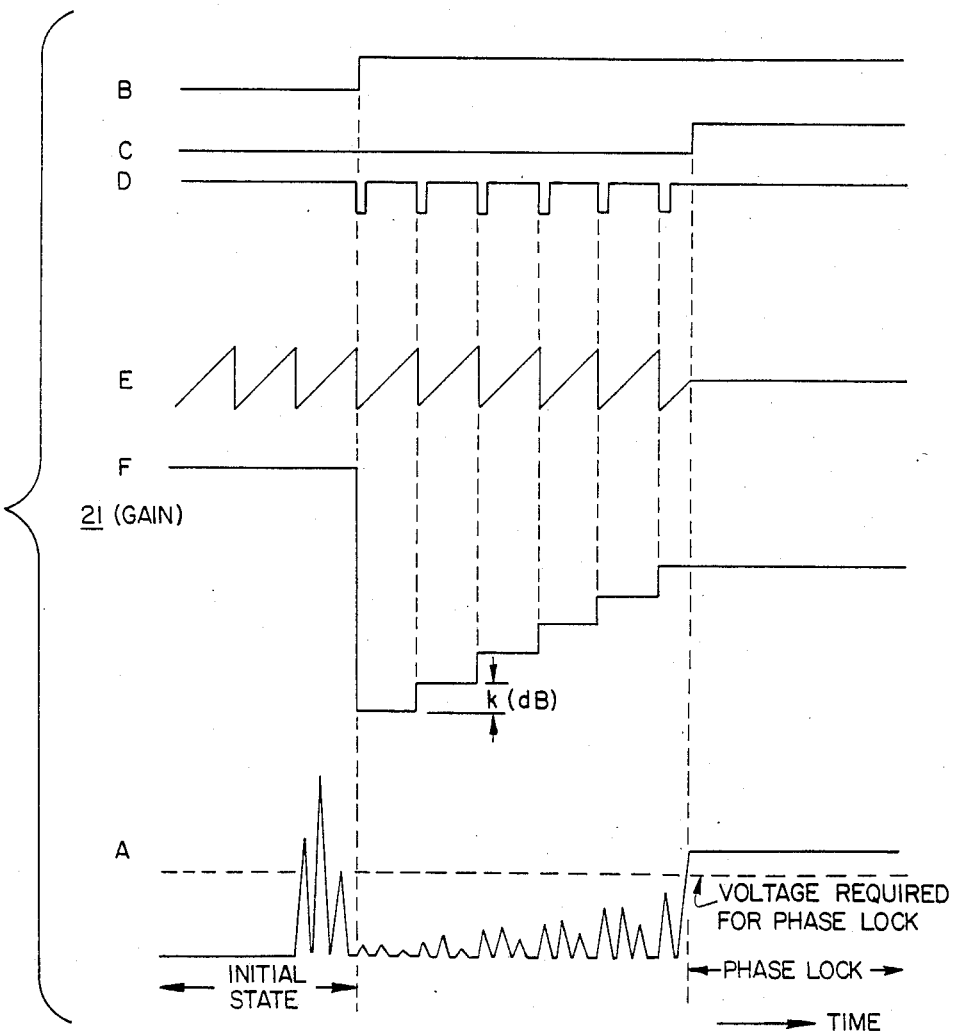
FIGS. 3A to 3F are timing charts for explaining the operation of the prior art signal detector of FIG. 2.

The operation of the signal detector of FIG. 2 is as follows in reference to FIG. 3. When the input signal is not supplied to the input terminal 1 or when the phase lock loop is not locked in, the attenuation of the attenuator 5 is set to the maximum, that is, the gain of the frequency converter 21 is set to the minimum by the gain controller 11. The sweep signal linearly changes the frequency of the local oscillator 3 through the hold circuit 12 and the voltage adder 13. The gain controller 11 provides control signals to the attenuator 5 for reducing the attenuation in small increments, for example k (dB) as in FIG. 3F, with each occurrence of the trigger pulse as shown in FIG. 3D from the sweep generator 10.

At the start of the detecting operation, the attenuator 5 is set to the maximum attenuation by the control signal from the phase lock detector 9 as in FIG. 3B, that is, the gain of the frequency converter 21 is set to the minimum. An input signal is applied to the input terminal 1 and the local oscillator 3 linearly changes its frequency according to the voltage level of the sweep signal. An intermediate frequency signal whose frequency is equal to the center frequency of the bandpass filter 4 is produced by the frequency converter 21 as a result of mixing the input signal with the local signal.

The sweep generator 10 repeatedly generates sweep signals while the attenuation in the attenuator 5 is reduced by k (dB) with each repetition of the sweep signal, until the amplitude of the intermediate frequency signal reaches a sufficient voltage for achieving phase lock in the phase lock loop. When the frequency of the intermediate frequency signal has become equal to that of the reference signal from the reference oscillator 7 as a result of sweeping the local oscillator 3, and the amplitude of the intermediate frequency signal has become sufficiently large by increasing the gain of the frequency converter 21 as above, the phase lock loop becomes locked-in. When the phase lock loop is locked in, the phase lock detector 9 provides a detection signal to the sweep generator 10 to stop sweeping, and accordingly the hold circuit 12 holds the voltage of the sweep signal at the time of the lock-in. At the same time, the trigger pulse which is being supplied to the gain controller 11 from the sweep generator 10 is stopped, to keep the attenuation at the same value as that at the time of lock-in. Therefore, according to the conventional signal detector, in the case where the input signal contains a plurality of frequency components, the frequency component that has the largest amplitude can be detected.

However, in this prior art, a long time is required until the frequency component with the maximum amplitude is detected. Namely, the attenuation in the attenuator 5 is set to the largest value at the start of the operation and is then reduced in small steps, such as k (dB), step by step with each sweep. The sweep signal generation has to be repeated many times until the detection of the desired frequency component. The time required for the detection increases with decrease of the amplitude of the largest frequency component contained in the input signal. Further, the attenuation step k (dB) as above has to be set to a small amount for detecting and distinguishing a small difference of amplitude between frequency components, which again causes the detection time to increase.

Figure 4:
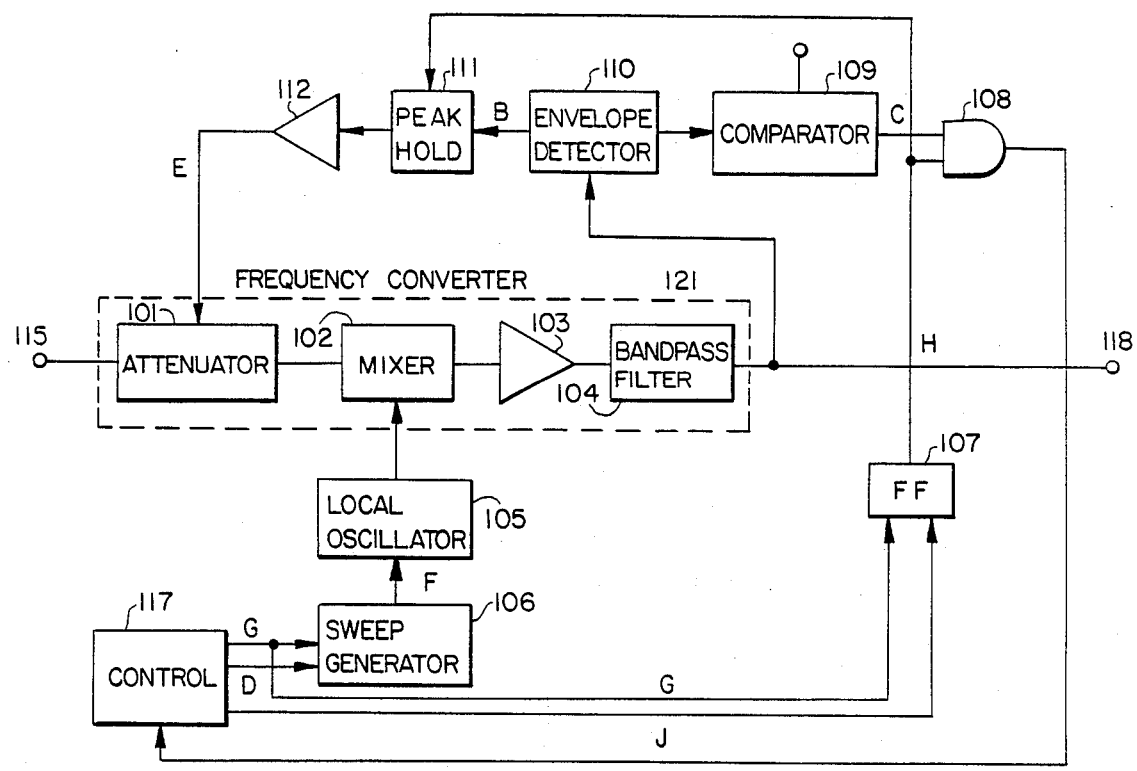
FIG. 4 is a block diagram of a signal detector in accordance with the present invention.

FIG. 4 shows a block diagram of a preferred embodiment of the present invention. An input signal applied at an input terminal 115 is provided to a mixer 102 wherein it is mixed with a local signal from a local oscillator 105. The attenuation value in the attenuator 101 is controlled by, for example, a voltage level supplied thereto. An intermediate frequency signal from the mixer 102 is provided to an envelope detector 110 via an amplifier 103 and a bandpass filter 104. The center frequency of the bandpass filter 104 is selected to be equal to the intermediate frequency so as to prevent other mixing signals from passing through subsequent circuits. The intermediate frequency signal is also output at a terminal 118 for being used, for example, to obtain its frequency.

The envelope detector 110 demodulates the intermediate frequency signal to obtain the envelope waveform of the intermediate frequency signal. The outputs from the envelope detector 110 are supplied to both a comparator 109 and a peak hold circuit 111. In the comparator 109 the outputs from the envelope detector 110 and a reference voltage are compared in voltage with each other, and if the outputs exceed the reference voltage, the comparator 109 provides a comparison signal to an AND gate 108.

The peak hold circuit 111 stores the amplitude of the peak voltage of the output from the envelope detector 110 and provides the stored peak voltage to the attenuator 101 through an amplifier 112 for determining the attenuation value. The relationship between the peak voltage and the attenuation value provides a negative feedback characteristic, that is, when the peak voltage is large, the input signal is attenuated more and vice versa. The attenuator 101, the mixer 102, the amplifier 103 and the bandpass filter 104 constitute a frequency converter 121. The total gain of the frequency converter 121 is selected initially, by adjusting the gain of the amplifier 103 and the sensitivity of the attenuator 101, so that the outputs from the detector 110 always slightly exceed the reference voltage supplied at the comparator 109 when the negative feedback loop is in operation, as above.

The comparator signal from the comparator 109 is supplied to a control circuit via the AND gate 108. A start signal is supplied by the control circuit 117 to a sweep generator 106 to control the start timing of the sweep signal. The start signal is also supplied to a flip-flop 107 to reset both the flip-flop 107 and the peak hold circuit 111.

FIGS. 5A to 5J are timing charts for explaining the operation of the preferred embodiment of FIG. 4. At time $t_0$, the start signal goes to high level as in FIG. 5G for starting the signal detecting operation. An input signal supplied to the input terminal 115 contains a plurality of frequency components such as $S_a$ to $S_e$ as shown in FIG. 5A. The frequency component that is desired to be detected is the frequency component $S_c$ which has the largest amplitude. FIG. 5B shows the output waveform of the envelope detector 110.

At time $t_0$, the flip-flop 107 and the peak hold circuit 111 are reset by the start signal as in FIG. 5G. The attenuation is set to the minimum value since the voltage from the amplifier 112 is at the lowest level. At the same time the sweep signal generator 106 starts sweeping so as to change the frequency of the local oscillator linearly.

At time $t_1$, the first frequency component $S_a$ is converted to an intermediate frequency signal and its peak voltage P shown by the respective dotted line in FIG. 5B is detected and its level is stored by the peak hold circuit 111. The output voltage of the amplifier 112 increases corresponding to the peak voltage P, so that the attenuation of the attenuator 101 increases. Thusly the intermediate frequency signal is decreased to a voltage level slightly exceeding the reference voltage of the comparator 109. That is, the total gain of the frequency converter 121 is decreased, so that the peak amplitude of the intermediate frequency signal corresponding to the frequency component $S_a$ becomes smaller at the input of the comparator 109, namely to provide the attenuated frequency component $S_{a1}$ the peak of which exceeds the reference voltage by only a small amount as shown by the solid line in FIG. 5B. The amplitude of the peak voltage P of the intermediate frequency signal corresponding to the frequency component $S_a$ is maintained until an envelope larger than that corresponding to the component $S_a$ is provided at the peak hold circuit 111.

At time $t_2$, since the frequency component $S_b$ whose amplitude is larger than that of the frequency component $S_a$ is converted to the intermediate frequency, the peak hold circuit 111 latches the peak voltage corresponding to the frequency component $S_b$, that is, the voltage increases by Q volts from the previously held P volts as illustrated in FIG. 5B. As a result, the output voltage L (volts) of the amplifier 112 increases to m (volts) as shown in FIG. 5E, so that the attenuation increases to cause the intermediate frequency signal corresponding to the component $S_b$ to become smaller in amplitude, as shown by the solid line signal $S_{b1}$, which is slightly larger than the reference voltage.

The peak voltage corresponding to the frequency component $S_b$ is kept unchanged until time $t_3$, at which time the intermediate frequency signal corresponding to the component $S_c$ which is larger than the component $S_b$ is applied to the peak hold circuit 111. Since the component $S_c$ is larger than the component $S_b$, the output voltage of the peak hold circuit 111 increases by R volts, so that the output voltage of the amplifier 112 goes to n volts, resulting in a further increase in attenuation. Therefore, the signal corresponding to the component $S_c$ at the output of the frequency converter 121 becomes the attenuated frequency component $S_{c1}$ which exceeds the reference voltage by a small amount, as shown by the solid line in FIG. 5B. Hereafter, the peak voltage of the peak hold circuit 111 is not changed until the next reset, that is, the next start signal as indicated by FIG. 5G, since both components $S_d$ and $S_e$ are smaller than the component $S_c$ as shown in FIG. 5A.

Since the intermediate frequency signals $S_{a1}$, $S_{b1}$ and $S_{c1}$ exceed the reference voltage, the comparator 109 generates comparison signals at times $t_1$, $t_2$ and $t_3$, respectively, as in FIG. 5C. However, the comparison signals are not supplied at the output of the AND gate 108 because of the low level of the flip-flop 107 as illustrated in FIG. 5H. After the end of the first sweep, at time $t_4$, the flip-flop 107 is set by a set signal shown in FIG. 5J from the control circuit 117 in synchronization with the falling edge of the first sweep, so that the AND gate is opened.

In the second sweep, since the peak voltage corresponding to the frequency component $S_c$ has been maintained by the peak hold circuit 111, only the intermediate frequency signal $S_{c1}$ can exceed the reference voltage. Therefore, at time $t_5$, in response the attenuated intermediate frequency signal $S_{c1}$ corresponding to the frequency component $S_c$, the comparator 109 generates a comparison signal as in FIG. 5C and provides it to the control circuit 117 through the AND gate 108. Upon receiving the comparison signal, the control circuit 117 provides a command signal to the sweep generator 106 to stop sweeping temporarily, as in FIG. 5D, so that the local oscillator is stopped from changing its frequency. Thus, the intermediate frequency signal corresponding to the frequency component $S_c$ continues to be provided at the output of the frequency converter 121. The intermediate frequency signal and the local signal are then measured, for example, to determine their frequencies, by a circuit arrangement which may be prepared along with the signal detector of the present invention.

As has been mentioned above, the frequency component having the largest amplitude in an input signal can be detected with high speed, that is, within the first sweep, in accordance with the present invention. The attenuator 101 in FIG. 4 is not necessarily always placed between the input terminal 115 and the mixer 102. It can be placed following the mixer 102 or the bandpass filter 104. In other words, the position of the attenuator 101 can be located wherever it can control the amplitude of the intermediate frequency signal at the output of the frequency converter 121.

Figure 6:
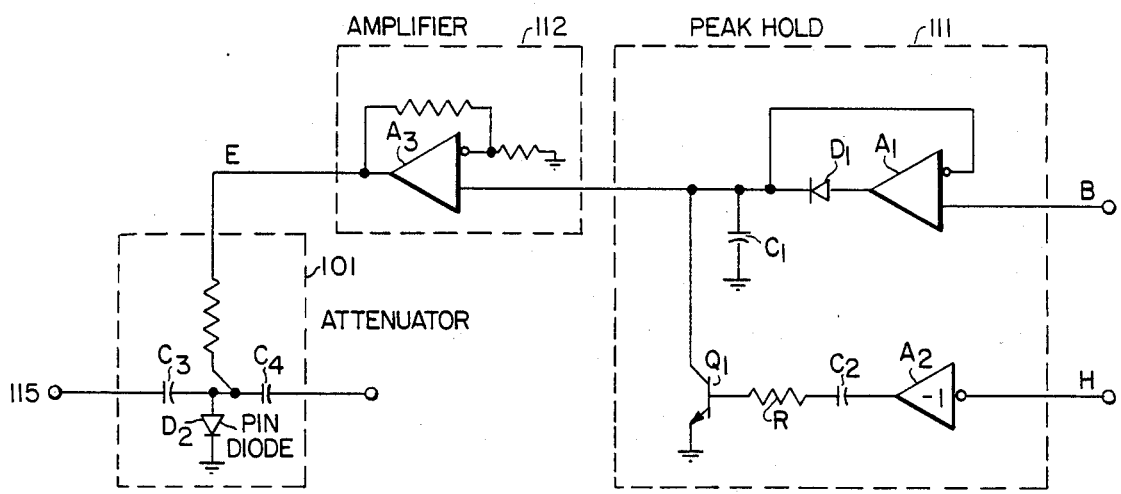
FIG. 6 shows examples of the detailed circuit diagrams of the peak hold circuit and the attenuator of FIG. 4.

FIG. 6 shows examples of the peak hold circuit 111, the amplifier 112 and the attenuator 101 employed in the embodiment of FIG. 4. The peak hold circuit 111 is formed for instance of an amplifier $A_1$, a diode $D_1$, capacitors $C_1$ and $C_2$, a resistance R, an inverter $A_2$ and a transistor $Q_1$. When a signal having a positive peak is provided to the amplifier $A_1$, the maximum voltage of the signal is charged in the capacitor $C_1$. Immediately after the peak of the signal, the diode $D_1$ is inversely biased and the peak voltage of the capacitor $C_1$ cannot be discharged, since the impedance at the connecting point of the capacitor $C_1$ is very high. The transistor $Q_1$ serves as a switch for discharging the voltage stored in the capacitor $C_1$, when the start signal of FIG. 5G is provided at the input terminal of the inverter $A_2$.

The attenuator 101 is formed of capacitors $C_3$ and $C_4$ and a PIN diode $D_2$. The impedance of the PIN diode $D_2$ is varied with the voltage supplied from the amplifier 112. Thus the input signal from the terminal 115 is attenuated by the capacitors $C_3$, $C_4$ and the impedance of the diode $D_2$, which constitute a T-type attenuator whose attenuation is variable according to the voltage change. The attenuator 101 can be replaced by other circuit arrangements that can reduce and increase the level of a signal, such as a variable gain amplifier.

Figure 1:
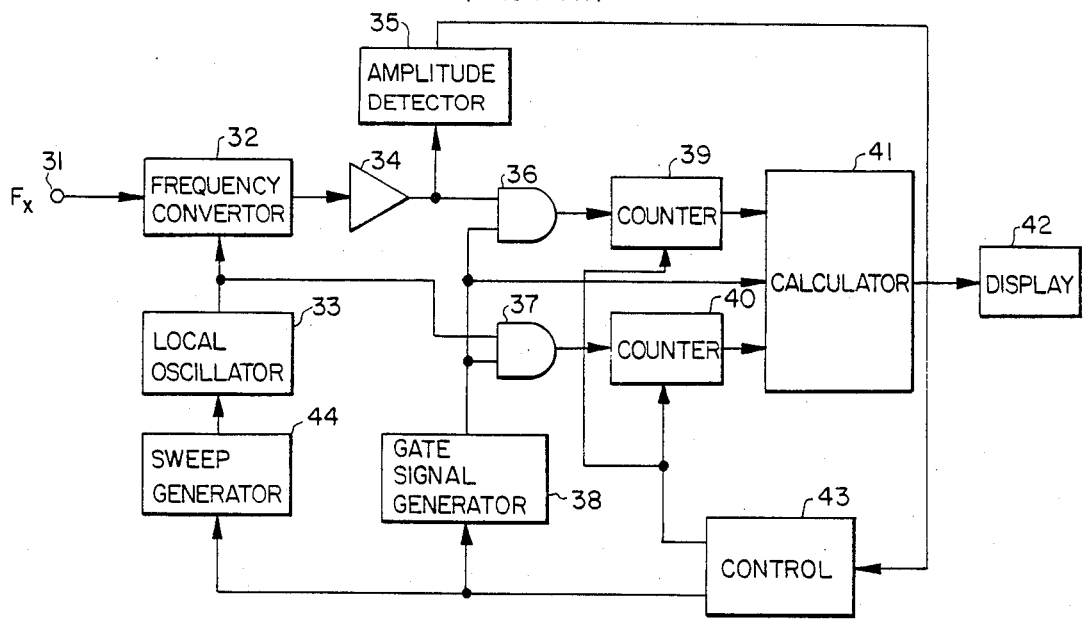
FIG. 1 is a block diagram of a conventional frequency measuring apparatus which is capable of measuring a microwave frequency.
Figure 5:
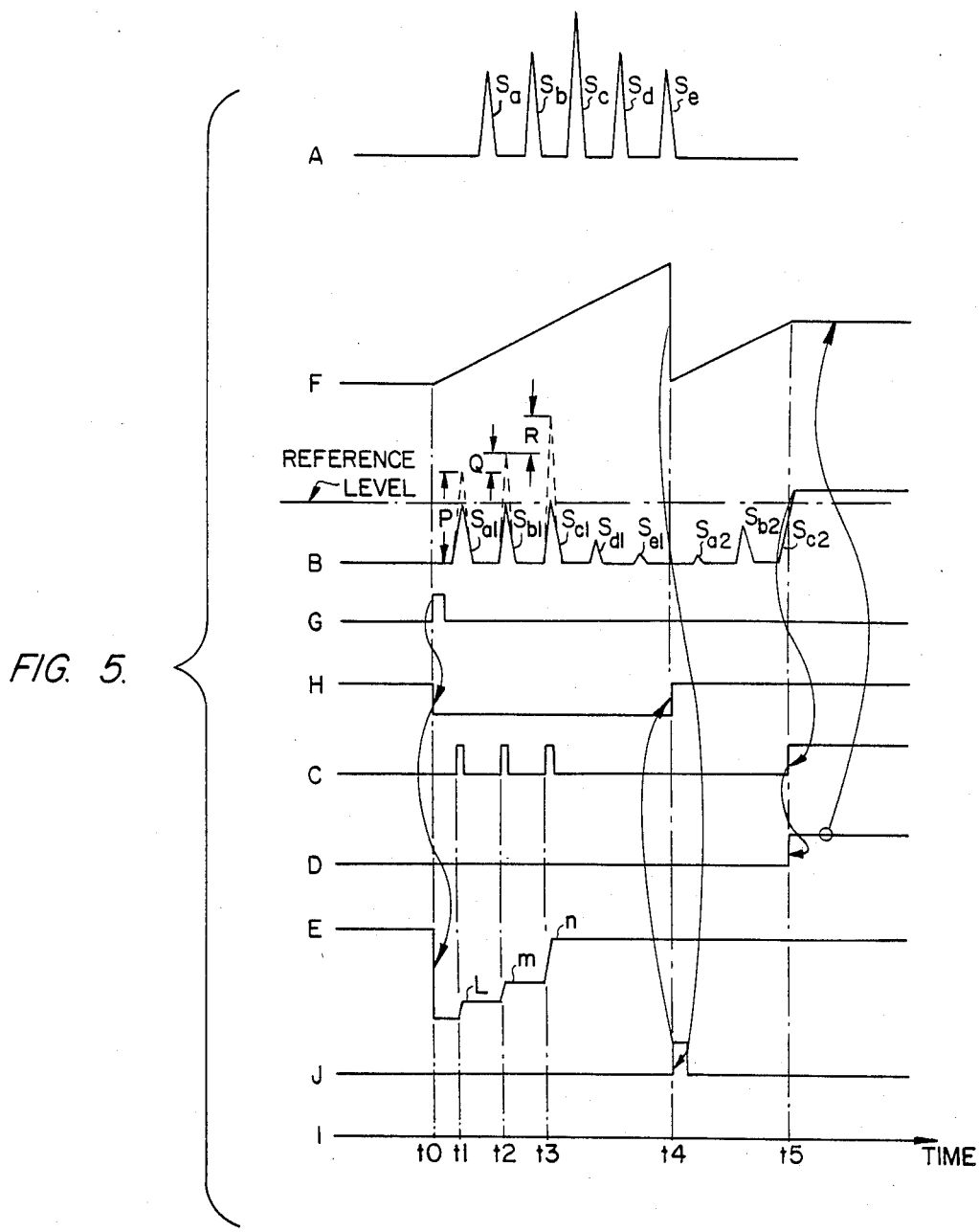
FIGS. 5A to 5J are timing charts for explaining the operation of the signal detector of FIG. 4.
Figure 7:
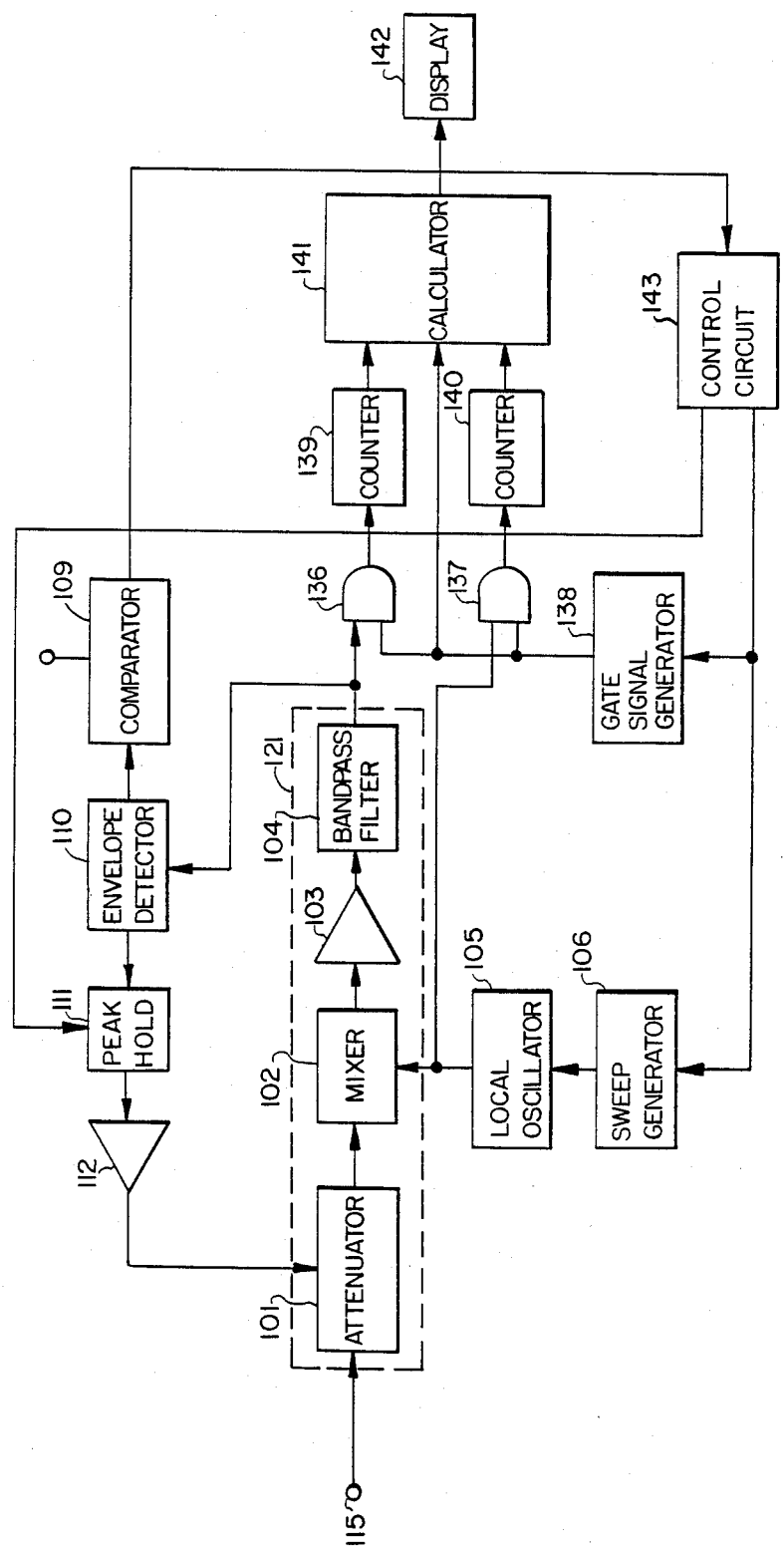
FIG. 7 is a block diagram of a frequency measuring apparatus employing a signal detector of the present invention.

FIG. 7 shows a block diagram of an example of a microwave frequency measuring apparatus employing a signal detector of the present invention. This example is a combination of the frequency measuring apparatus of FIG. 1 and the signal detector of FIG. 4. An input signal applied at the input terminal 115 contains the desired frequency component whose frequency is to be measured and which has the largest amplitude, along with other frequency components such as harmonic and non-harmonic signals. The desired frequency component is detected first by the signal detector according to the operation described above, and thus the intermediate frequency signal corresponding to the desired frequency component is provided at the output of the frequency converter 121. After the desired frequency component is detected, the frequency sweep in the local oscillator 105 is stopped so that the frequency of the intermediate frequency signal at the output of the frequency converter 121, and the local signal, can both be counted. The intermediate frequency signal thus obtained is supplied to an AND gate 136, whereas the local signal is supplied to an AND gate 137. The AND gate 136 and 137 are opened during a fixed time interval in response to a gate signal from a gate signal generator 138. Counters 139 and 140 count the number of signals from the AND gates 136 and 137, respectively, and provide the counted values to a calculator 141 to store the counted value in it. A control circuit 143 controls the operation of the apparatus by generating a reset signal, a sweep stop signal and the like. The control circuit 143 includes in it the identical function to the AND gate 108 and the flip-flop 107 as illustrated in FIGS. 4 and 5. A display 142 displays the frequency of the input signal that is calculated by the calculator 141, as desired.

Figure 8:
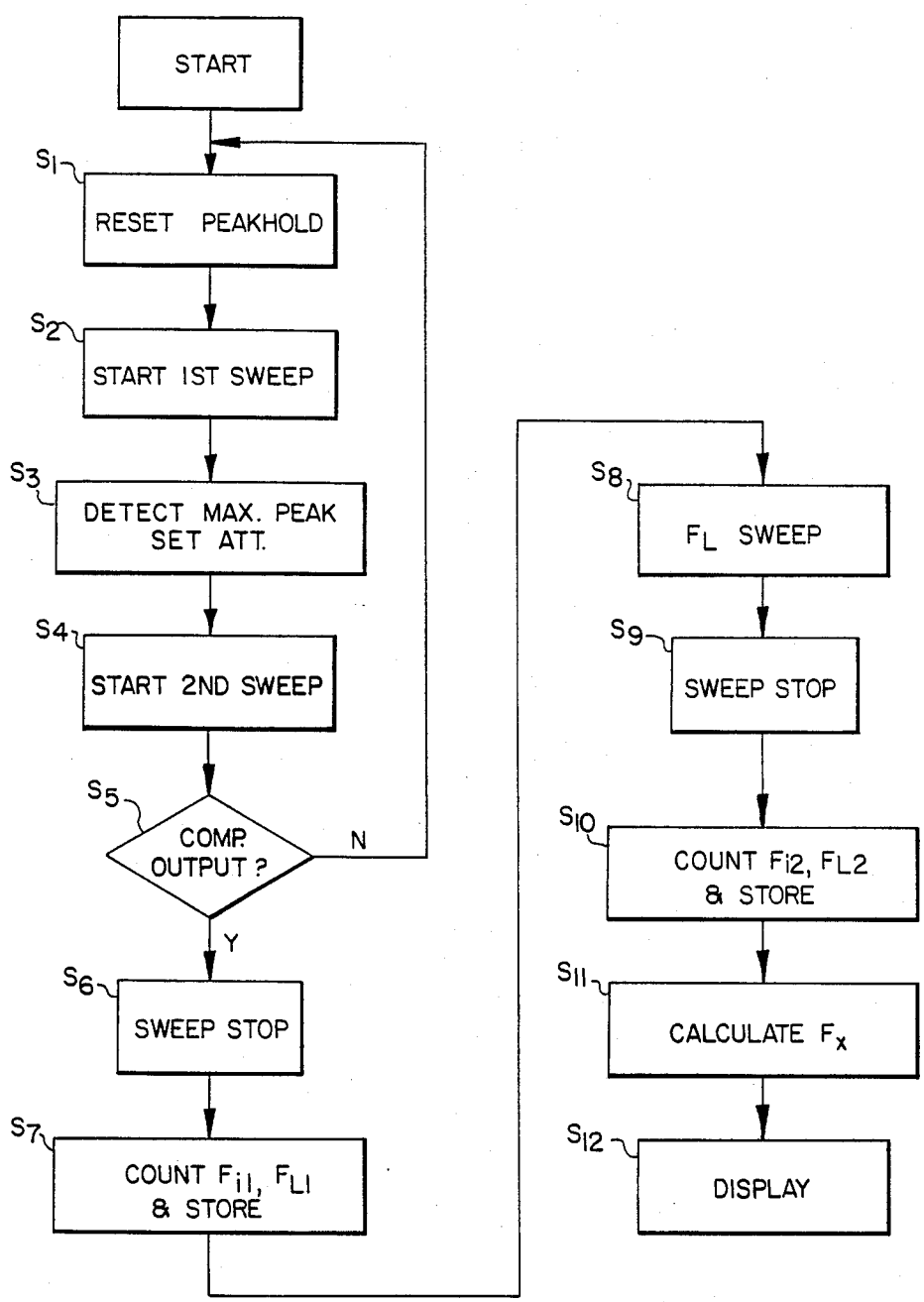
FIG. 8 is a flowchart of the operation of the frequency measuring apparatus of FIG. 7.

The operation of the frequency measuring apparatus of FIG. 7 is illustrated in the flowchart of FIG. 8. At step $S_1$, the peak hold circuit 111 is reset by the reset pulse from the control circuit 143. As a result, the attenuation of the attenuator 101 is set to the minimum value, which means the total gain of the frequency converter 121 is set to the largest value. The first sweep is started by a sweep start command from the control circuit 143, at step $S_2$, for linearly changing the frequency of the local oscillator 105. At step $S_3$, the frequency component having the largest amplitude among plural frequency comonents is detected by the procedure described above in regard to FIGS. 4 and 5, and the attenuation in the attenuator 101 is set so that the comparator 109 responds in the next sweep only to the component having the largest amplitude. During the step $S_3$, the comparison signals from the comparator 109 are inhibited by an inhibit command from the control circuit 143.

The second sweep starts at step $S_4$. At step $S_5$, it is checked if the comparison signal is generated by the comparator 109 within the period of the second sweep. If the comparison signal is generated, the procedure goes to step $S_6$ wherein the local signal sweep is stopped at the frequency that causes the largest component to be generated as the intermediate frequency signal. If no comparison signal occurs by the end of the second sweep, the process goes back to step $S_1$. This case may happen if the input signal disappears or if its level decreases during the operation. At step $S_6$, the frequency of the intermediate frequency signal thus detected and the local signal, which causes the intermediate frequency signal to occur by mixing with the input signal, are counted by the counters 139, 140, the AND gates 136, 137 and the gate signal generator 138, and the counts thus obtained are stored in the calculator 141 at step $S_7$.

The local oscillator is swept a little at step $S_8$, and is again stopped from sweeping at step $S_9$. The intermediate frequency signal is still at the output of the frequency converter 121 with its amplitude almost the same as before, since the frequency change of the local oscillator is small and the intermediate frequency signal is within the passband of the bandpass filter 104. At step $S_{10}$, the frequencies of the intermediate frequency signal and the local signal are counted and the counted values are stored in the calculator 141. The input signal frequency $F_x$ is calculated by the calculator 141 at step $S_{11}$ according to equations (1) to (3) with the use of the data obtained in the first and second measurements, and the resulting input signal frequency is displayed by the display 142 at step $S_{12}$.

What is claimed is:

1. A signal detector for detecting the frequency component having the largest amplitude in a plurality of frequency components contained in an input signal, comprising
    a sweep generator for generating a sweep signal,
    a local oscillator for generating a local signal whose frequency is swept by the sweep signal from the sweep generator,
    a frequency converter for converting said input signal to an intermediate frequency signal by mixing said input signal with said local signal,
    an envelope detector for detecting the envelope of the intermediate frequency signal from the frequency converter and for providing a corresponding output,
    a peak-hold circuit for storing the peak voltage of said output of the envelope detector and for providing a corresponding output,
    negative feedback means for controlling the gain of the frequency converter according to said output from the peakhold circuit,
    a comparator for comparing said output of the envelope detector with a reference voltage level and for outputting a corresponding comparison signal when said output of the envelope detector exceeds said reference level, after said desired gain is determined,
    wherein a desired gain of said frequency converter is determined by the amplitude of said frequency component having the largest amplitude, and said desired gain of said frequency converter is maintained during at least part of a subsequent sweep of said sweep signal, until said output of said frequency converter corresponds to said frequency component having the largest amplitude.

2. The detector of claim 1, comprising means for halting the sweep of said sweep signal when said comparator outputs said comparison signal during said subsequent sweep and for subsequently sampling the frequency of having the largest amplitude.

3. The detector of claim 1 or 2, comprising control means for determining said desired gain of the frequency converter during a first sweep of said sweep signal.

4. The detector of claim 3, wherein said control means provide that said subsequent sweep is the second sweep of said sweep signal.

5. The detector of claim 1 or 2, said frequency converter comprising
    a mixer for mixing said local signal with said input signal, and for outputting a signal corresponding to said intermediate frequency signal,
    a bandpass filter for receiving a signal corresponding to the output of said mixer and for providing a corresponding output, and
    at least one of an attenuator having an adjustable attenuation and an amplifier having an adjustable gain connected so that said desired gain can be set by said negative feedback means.

6. The detector of claim 3, said frequency converter comprising
    a mixer for mixing said local signal with said input signal, and for outputting a signal corresponding to said intermediate frequency signal,
    a bandpass filter for receiving a signal corresponding to the output of said mixer and for providing a corresponding output, and
    at least one of an attenuator having an adjustable attenuation and an amplifier having an adjustable gain connected so that said desired gain can be set by said negative feedback means.

7. The detector of claim 1 or 2, said peak-hold circuit including an amplifier having as a first input said output of the envelope detector, a diode connected to receive as an input the output of said amplifier and to provide as an output a second input to said amplifier, a capacitor connected between the output of said diode and ground, wherein the output of said diode provides said output of said breakhold circuit.

8. The detector of claim 1 or 2, wherein said negative feedback means includes:
    an amplifier having as one input said output of said peak-hold circuit, and an inverting input connected through a first resistance to ground and through a second resistance to the output of said amplifier, said output of said amplifier being supplied as the input to said frequency converter.

9. The detector of claim 4, wherein said control means includes sampling means for said sampling of said frequency component having the largest amplitude and for sampling the respective frequency of said local oscillator at each frequency thereof at which said sampling of said frequency component having the largest amplitude occurs at a plurality of different values of the sweep signal in the vicinity of where it is stopped sweeping, wherein the harmonic number of the local signal and the frequency of said frequency component having the largest amplitude can be determined.

10. The detector of claim 9, said sampling means including first and second counters respectively connected to the outputs of said frequency converter and said local oscillator, for counting the frequencies of the respective outputs at said plurality of different values of where said sweep signal is stopped during said subsequent sweep.

11. A detector for determining values corresponding to the frequency of a frequency component having the largest amplitude, in an input signal having a plurality of frequency components, comprising:

first means for mixing said input signal with a local signal to provide a mixed signal, for sweeping the frequency of said local signal through a sweep range, for outputting any components of said mixed signal within a predetermined bandpass, and for changing the gain between each said frequency component of the input signal and the corresponding component of said mixed signal output from said means, second means for determining said gain for said first means for said frequency component of said input signal having the largest amplitude, and for providing a compare output when said output of said first means is equal to or greater than a predetermined value, and third means for first operating said first means and said second means, to sweep said local signal through said sweep range while determining a desired value of said gain so that said output of said first means corresponding to said frequency component having the largest amplitude in said input signal is equal to or greater than said predetermined value, and for sequentially operating said first means with said desired value of said gain set in said first means, and for beginning a subsequent sweep of said local signal and for halting said subsequent sweep when said compare output is providing during said subsequent seeep.

12. The device of claim 11, said third means comprising means for determining numbers corresponding to the frequencies of said output of said first means and of said local signal, after said halt of the subsequent sweep, in the vicinity of the frequency of the local signal at which the halt occurs, whereby the frequency of said frequency component of the input signal having the largest amplitude can be determined.

13. The device of claim 12, wherein said third means computes the harmonic number of said local signal and subsequently the frequency of said frequency component of the input signal having the largest amplitude.

14. A circuit comprising frequency means for frequency scanning an input signal with a plurality of frequency components of respective amplitudes over a predetermined frequency range and for providing an output corresponding at respective times during the sweep to each said frequency component of said input signal, and for changing the gain between said input signal and said output, control means for receiving said output of said frequency means during said frequency scanning, for determining during said scanning over said range, gain data corresponding to the value of said output corresponding to said frequency component of said input signal having the largest amplitude and for subsequently restarting said scanning by said frequency means for subsequently scanning at least part of said range, with the gain of said frequency means set according to said gain data, wherein data corresponding to the frequency of said frequency component having the largest amplitude of said input signal is determined as a result of said output of said frequency means attaining a value corresponding to said gain data during the subsequent scanning by said means for said at least a part of said range.

15. The circuit of claim 14, wherein said frequency means includes gain means for setting the gain of said output of said frequency means, wherein the gain of said gain means is initially set to an initial value for beginning said scanning over said frequency range for said determining of said gain data, said determining of said gain data comprises reducing the gain of said gain means in accordance with each increased envelope amplitude of said output during said scanning, and the gain of said gain means for the subsequent scanning is set to a value so that said output of said frequency means during the subsequent scanning attains a predetermined value when said output of the frequency means corresponds to said frequency component of said input signal having the largest amplitude.

16. The circuit of claim 15, wherein the frequency of said output from said frequency means during said scanning of said range changes in correspondence to said frequency components of said input signal, and said control means stops said subsequent scanning by said frequency means when said output of said frequency means attains said predetermined value, and measures the frequency of said output signal in the vicinity of where said subsequent scanning is stopped, corresponding to the frequency of said frequency component of said input signal having the largest amplitude.

17. The circuit of claim 16, wherein said frequency means includes a local oscillator the fundamental frequency of which is swept to provide and output for said frequency scanning, a frequency mixer having as inputs said input signal and the output of said local oscillator, and a bandpass filter having as an input the output of said frequency mixer and providing as an output said output of said frequency means, and the sweeping by said local oscillator is stopped when the amplitude of said output of said frequency means attains said predetermined value during said subsequent sweeping, a pair of frequency data corresponding to the frequency of said output of the frequency means and to the frequency of said local oscillator are determined in the vicinity of where said subsequent frequency scan is stopped, and the frequency of the frequency component of the input signal having the maximum amplitude is determined based on said each pair of frequency data.

18. The circuit of claim 17, wherein bandpass window of said bandpass filter is set to correspond to the Nth harmonic of said fundamental frequency, two pairs of said frequency data are determined, and the frequency of said frequency component of said input signal having the largest amplitude and the value N of said harmonic are determined based on said two pairs of frequency data.

19. A circuit for measuring the frequency of the frequency component of an input signal having the maximum amplitude, comprising

- a frequency converter having said input signal as a first input, a second input for a local frequency signal for being mixed with said input signal, and as an output a predetermined frequency range of the mixed input and local frequency signals, and having gain means for changing the gain of said output,
- a local oscillator for providing as an output said local frequency signal to said frequency converter, and having an input for sweeping the frequency of said local frequency signal,
- a sweep generator for providing as an output said input to said local oscillator,
- an envelope detector having as an input said output of said frequency converter, for detecting the amplitude of said output of said frequency converter, and for providing a corresponding output,
- a peak hold circuit having as an input said output of said envelope detector, for providing as an output the peak value of said output of said envelope detector,
- negative feedback means having as an input the output of said peak hold circuit,
- a comparator having as inputs a reference level and the output of said envelope detector, and for providing a corresponding output when said output of said envelope detector is at least equal to said reference level, and
- control means for operating said sweep generator to sweep said local oscillator in frequency to cause said output of said frequency converter to occur for any corresponding ones of said frequency components of said input signal for operating said envelope detector, negative feedback means and gain means to set the gain of said output of said frequency converter by the end of the sweep to be at least equal to said reference level when the output of said envelope detector, corresponding to the frequency component of said input signal having the largest amplitude is equal to or greater than said reference level for subsequently restarting said sweep of said local oscillator and for stopping the subsequent sweep when said output of said comparator determines that the output of said frequency converter has attained said reference level, wherein the frequency of the frequency component of said input signal having the largest amplitude is determined from the frequencies of said local oscillator and of said output of said frequency converter for respective frequencies in the vicinity of which said subsequent scanning is stopped.

* * * * *